United States Patent
Kang et al.

(10) Patent No.: US 11,752,493 B2
(45) Date of Patent: Sep. 12, 2023

(54) SUPPORTED CATALYST, CARBON NANOTUBE ASSEMBLY, AND PREPARATION METHOD THEREFOR

(71) Applicant: LG Chem, Ltd., Seoul (KR)

(72) Inventors: KyungYeon Kang, Daejeon (KR); Dongchul Lee, Daejeon (KR); SungJin Kim, Daejeon (KR); JaeKeun Yoon, Daejeon (KR); Seungyong Lee, Daejeon (KR); Jinmyung Cha, Daejeon (KR)

(73) Assignee: LG CHEM, LTD., Seoul (KR)

( * ) Notice: Subject to any disclaimer, the term of this patent is extended or adjusted under 35 U.S.C. 154(b) by 69 days.

(21) Appl. No.: 16/654,892

(22) Filed: Oct. 16, 2019

(65) Prior Publication Data

US 2020/0047164 A1 Feb. 13, 2020

Related U.S. Application Data

(63) Continuation of application No. 14/432,027, filed as application No. PCT/KR2014/006230 on Jul. 10, 2014, now abandoned.

(30) Foreign Application Priority Data

Jul. 10, 2013 (KR) .......................... 10-2013-0080813
Jul. 10, 2014 (KR) .......................... 10-2014-0087041

(51) Int. Cl.
| | | |
|---|---|---|
| *B22F 9/20* | (2006.01) | |
| *B01J 23/887* | (2006.01) | |
| *B01J 37/08* | (2006.01) | |
| *C01B 32/162* | (2017.01) | |
| *B01J 35/00* | (2006.01) | |
| *B01J 37/02* | (2006.01) | |
| *C23C 16/26* | (2006.01) | |
| *B01J 35/10* | (2006.01) | |
| *B01J 35/02* | (2006.01) | |

(52) U.S. Cl.
CPC ....... *B01J 23/8877* (2013.01); *B01J 35/0026* (2013.01); *B01J 37/0203* (2013.01); *B01J 37/0213* (2013.01); *B01J 37/086* (2013.01); *C01B 32/162* (2017.08); *C23C 16/26* (2013.01); *B01J 35/023* (2013.01); *B01J 35/1019* (2013.01); *B01J 35/1042* (2013.01); *B01J 37/0205* (2013.01); *B01J 2523/00* (2013.01); *C01B 2202/08* (2013.01); *C01B 2202/36* (2013.01); *C01P 2004/60* (2013.01); *Y10T 428/2991* (2015.01)

(58) Field of Classification Search
None
See application file for complete search history.

(56) References Cited

U.S. PATENT DOCUMENTS

| | | | |
|---|---|---|---|
| 6,020,285 A | 2/2000 | Hancock | .................. B01J 23/02 502/250 |
| 2001/0036549 A1 | 11/2001 | Mandeville | .............. B01J 23/88 428/367 |
| 2007/0074601 A1* | 4/2007 | Hong | ...................... B01J 6/001 75/345 |
| 2008/0135816 A1 | 6/2008 | Bordere | ..................... B01J 8/24 252/511 |
| 2010/0266478 A1* | 10/2010 | Kim | ...................... B01J 35/002 423/447.1 |
| 2013/0171054 A1* | 7/2013 | Kim | ...................... B01J 35/026 423/447.2 |

FOREIGN PATENT DOCUMENTS

| | | |
|---|---|---|
| DE | 102009047741 A1 | 6/2010 |
| JP | 2009-090251 A | 4/2009 |
| JP | 2010-006663 A | 1/2010 |
| JP | 2010-024609 A | 2/2010 |
| KR | 10-2009-0070087 A | 7/2009 |
| KR | 10-2010-0045247 A | 5/2010 |
| KR | 10-2010-0067048 A | 6/2010 |
| KR | 10-2010-0074002 A | 7/2010 |
| KR | 10-2012-0030482 A | 3/2012 |
| WO | 2009/153970 A1 | 12/2009 |
| WO | 2011/009071 A1 | 1/2011 |

OTHER PUBLICATIONS

Yao, et al., "Structural and chemical characterization of ribbon-like particles in Co/Mn/Al/Mg multi-metal catalyst," Material Science, Dec. 2009, pp. 367-368.

* cited by examiner

*Primary Examiner* — Yun Qian
(74) *Attorney, Agent, or Firm* — BRYAN CAVE LEIGHTON PAISNER LLP

(57) ABSTRACT

The present invention relates to an impregnated supported catalyst, a carbon nanotube aggregate, and a method for producing the carbon nanotube aggregate. The carbon nanotube aggregate includes a four-component catalyst in which catalytic components and active components are supported on a granular support, and bundle type carbon nanotubes grown on the catalyst. The carbon nanotube aggregate has an average particle diameter of 100 to 800 μm, a bulk density of 80 to 250 kg/m$^3$, and a spherical or potato-like shape.

12 Claims, 5 Drawing Sheets

SUPPORTED CATALYST, CARBON NANOTUBE ASSEMBLY, AND PREPARATION METHOD THEREFOR

This application is a continuation of U.S. patent application Ser. No. 14/432,027, filed Mar. 27, 2015, which is the U.S. national stage of International Application No. PCT/KR2014/006230, filed Jul. 10, 2014, and claims the benefit of Korean Application No. 10-2014-0087041, filed Jul. 10, 2014 and Korean Application No. 10-2013-0080813, filed Jul. 10, 2013, all of which are hereby incorporated by reference in their entirety for all purposes as if fully set forth herein.

BACKGROUND OF THE INVENTION

1. Field of the Invention

The present invention relates to a supported catalyst, a carbon nanotube aggregate, and a method for producing the carbon nanotube aggregate.

2. Description of the Related Art

Carbon nanostructures (CNSs) refer collectively to nano-sized carbon structures having various shapes, such as nanotubes, nanohairs, fullerenes, nanocones, nanohorns, and nanorods. Carbon nanostructures can be widely utilized in a variety of technological applications because they possess excellent characteristics.

Carbon nanotubes (CNTs) are tubular materials consisting of carbon atoms arranged in a hexagonal pattern and have a diameter of approximately 1 to 100 nm. Carbon nanotubes exhibit insulating, conducting or semiconducting properties depending on their inherent chirality. Carbon nanotubes have a structure in which carbon atoms are strongly covalently bonded to each other. Due to this structure, carbon nanotubes have a tensile strength approximately 100 times that of steel, are highly flexible and elastic, and are chemically stable.

Carbon nanotubes are divided into three types: single-walled carbon nanotubes (SWCNTs) consisting of a single sheet and having a diameter of about 1 nm; double-walled carbon nanotubes (DWCNTs) consisting of two sheets and having a diameter of about 1.4 to about 3 nm; and multi-walled carbon nanotubes (MWCNTs) consisting of three or more sheets and having a diameter of about 5 to about 100 nm.

Carbon nanotubes are being investigated for their commercialization and application in various industrial fields, for example, aerospace, fuel cell, composite material, biotechnology, pharmaceutical, electrical/electronic, and semiconductor industries, due to their high chemical stability, flexibility and elasticity. However, carbon nanotubes have a limitation in directly controlling the diameter and length to industrially applicable dimensions for practical use owing to their primary structure. Accordingly, the industrial application and use of carbon nanotubes are limited despite their excellent physical properties.

Carbon nanotubes are generally produced by various techniques, such as arc discharge, laser ablation, and chemical vapor deposition. However, arc discharge and laser ablation are not appropriate for mass production of carbon nanotubes and require high arc production costs or expensive laser equipment. Chemical vapor deposition using a vapor dispersion catalyst has the problems of a very low synthesis rate and too small a size of final CNT particles. Chemical vapor deposition using a substrate-supported catalyst suffers from very low efficiency in the utilization of a reactor space, thus being inappropriate for mass production of CNTs. Thus, studies on catalysts and reaction conditions for chemical vapor deposition are currently underway to increase the yield of carbon nanotubes.

Catalytically active components of the catalysts usually take the form of oxides, partially or completely reduced products, or hydroxides. The catalysts may be, for example, supported catalysts or coprecipitated catalysts, which can be commonly used for CNT production. Supported catalysts are preferably used for the following reasons: supported catalysts have a higher inherent bulk density than coprecipitated catalysts; unlike coprecipitated catalysts, supported catalysts produce a small amount of a fine powder with a size of 10 microns or less, which reduces the possibility of occurrence of a fine powder due to attrition during fluidization; and high mechanical strength of supported catalysts effectively stabilizes the operation of reactors.

Many methods have been proposed to prepare supported catalysts. For example, a supported catalyst is prepared by an impregnation method including mixing an aqueous metal solution with a support, followed by coating-drying. This method has the disadvantage that the amount of the catalyst loaded is limited. Non-uniform distribution of active components and catalytic components greatly affects CNT growth yield and CNT diameter distribution, but no technique has been proposed to control the non-uniform distribution.

Particularly, a supported catalyst prepared by the conventional impregnation method can be used for the synthesis of carbon nanotubes. In this case, however, the yield of carbon nanotubes is less than 1000% and the amount of the catalyst loaded is large, showing a limited influence on yield. The catalyst is a bundle type with low bulk density and the feeding rate of reaction gas is thus lowered, resulting in low CNT productivity.

Under these circumstances, more research needs to be done to synthesize carbon nanotubes with high bulk density in high yield despite the use of supported catalysts.

SUMMARY OF THE INVENTION

The present invention has been made in an effort to overcome the disadvantage of low CNT yield encountered in the use of conventional supported catalysts, and it is an object of the present invention to provide carbon nanotubes whose bulk density and yield are improved by simultaneously controlling the activity of a catalyst and the amount of a fine powder, and a method for producing the carbon nanotubes.

One aspect of the present invention provides an impregnated supported catalyst prepared by sequentially adding a multi-carboxylic acid and precursors of first and second catalytic components to precursors of first and second active components to obtain a transparent aqueous metal solution, impregnating an aluminum-based granular support with the transparent aqueous metal solution, followed by drying and calcination, wherein the supported catalyst has a bulk density of 0.8 to 1.5 $g/cm^3$.

Another aspect of the present invention provides a carbon nanotube aggregate including a four-component catalyst in which catalytic components and active components are supported on a granular support, and bundle type carbon nanotubes grown on the catalyst wherein the carbon nanotube aggregate has an average particle diameter of 100 to 800 μm, a bulk density of 80 to 250 kg/m³, and a spherical or potato-like shape.

The carbon nanotubes may have an aspect ratio of 0.9 to 1 and a strand diameter of 10 to 50 nm.

The catalyst may have an average aspect ratio ($A_{CAT}$) of 1.2 or less and the carbon nanotube aggregate may have an average aspect ratio ($A_{CNT}$) of 1.2 or less.

The bundle type carbon nanotubes grown on the aluminum-based granular support may have a particle size distribution ($D_{cnt}$) of 0.5 to 1.0.

The four-component catalyst includes first and second catalytic components and first and second active components, and the number of moles (x) of the first catalytic component, the number of moles (y) of the second catalytic component, the number of moles (p) of the first active component, and the number of moles (q) of the second active component with respect to 100 moles of the support may satisfy the following relationships:

$10 \leq x \leq 40$;

$1 \leq y \leq 20$;

$0.1 \leq y/[x+y] \leq 0.5$;

$1 \leq p+q \leq 20$; and $0.1 \leq [p+q]/[x+y] \leq 0.5$.

The granular support may have a bulk density of 0.6 to 1.2 g/cm³, and the catalyst in which the catalytic components and the active components are supported may have a bulk density of 0.8 to 1.5 g/cm³.

The granular support may have an aspect ratio of 1.2 or less, and the average aspect ratio ($A_S$) of the support before the catalytic components and the active components are supported on the support and the average aspect ratio ($A_{CAT}$) of the catalyst after the catalytic components and the active components are supported on the support may satisfy $0.8 \leq A_{CAT}/A_S \leq 1.2$.

The multi-carboxylic acid may be used in an amount of 0.2 to 2.0 moles, assuming that the sum of the moles (p+q) of the first and second active components equals to 1.

The multi-carboxylic acid may be selected from dicarboxylic acids, tricarboxylic acids, tetracarboxylic acids, and mixtures thereof.

The calcination may be performed at 650 to 800° C.

The transparent aqueous metal solution may have a concentration of 0.01 to 0.4 g/ml.

According to one embodiment, the first catalytic component may be cobalt (Co), the second catalytic component may be selected from iron (Fe), nickel (Ni), and a mixture thereof, the first active component may be molybdenum (Mo), and the second active component may be vanadium (V).

The first and second active components may be in a weight ratio of 6-0.1:0.1-6.

According to one embodiment, the catalyst may have a structure in which the surface and pores of the aluminum-based support are coated with a monolayer or multilayer of the catalytic components and the active components, and the amount of a fine powder having a number average particle diameter not larger than 32 μm, as measured after ultrasonic shaking at 40 watts for 1 minute, may be 10% or less of the amount of the catalyst.

Yet another aspect of the present invention provides a method for producing a carbon nanotube aggregate, including 1) sequentially blending a multi-carboxylic acid component and an aqueous solution of precursors of first and second catalytic components with an aqueous solution of precursors of first and second active components to obtain a transparent aqueous metal solution, and mixing an aluminum-based granular support with the transparent aqueous metal solution, 2) drying the mixture under vacuum at 40 to 80° C. and calcining the dried mixture at 650 to 800° C. to obtain a catalyst for carbon nanotube production in which the surface and pores of the aluminum-based support are impregnated and coated with the catalytic components and the active components, 3) feeding the catalyst for carbon nanotube production into a fluidized bed reactor and introducing at least one carbon source selected from $C_1$-$C_4$ saturated or unsaturated hydrocarbons, and optionally together with a mixed gas hydrogen and nitrogen, into the reactor at 500 to 900° C., and 4) decomposing the carbon source and growing carbon nanotubes on the catalyst surface by chemical vapor synthesis.

According to one embodiment, the method may further include aging at 45 to 80° C. before the drying under vacuum in step 2).

The method may further include preliminarily calcining at 250 to 400° C. before the calcination in step 2).

The method may further include impregnating a portion of the total amount of the aqueous metal solution into the aluminum-based granular support just before the preliminary calcination and impregnating the remainder of the aqueous metal solution into the aluminum-based granular support just before the calcination.

Details of other embodiments of the present invention are included in the detailed description that follows.

The present invention can overcome the disadvantage of low CNT yield encountered in the use of conventional impregnated catalysts for carbon nanotube production. The supported catalyst of the present invention has controlled activity and can produce a controlled amount of a fine powder, enabling the synthesis of bundle type carbon nanotubes in high yield. Therefore, the supported catalyst of the present invention can find application in various fields, such as energy materials, functional composites, pharmaceuticals, batteries, and semiconductors, where carbon nanotubes are used.

DETAILED DESCRIPTION OF THE INVENTION

Figure 1:
FIG. 1 is a SEM image showing a bulk shape of CNTs produced in Example 1-1.

The present invention will now be described in more detail.

The present invention provides an impregnated supported catalyst prepared by sequentially adding a multi-carboxylic acid and precursors of first and second catalytic components to precursors of first and second active components to obtain a transparent aqueous metal solution, impregnating an aluminum-based granular support with the transparent aqueous metal solution, followed by drying and calcination, wherein the supported catalyst has a bulk density of 0.8 to 1.5 g/cm$^3$.

The present invention also provides a carbon nanotube aggregate including a four-component catalyst in which catalytic components and active components are supported on a granular support, and bundle type carbon nanotubes grown on the catalyst wherein the carbon nanotube aggregate has an average particle diameter of 100 to 800 μm, a bulk density of 80 to 250 kg/m$^3$, and a spherical or potato-like shape.

The bulk density can be defined by Expression 1:

$$\text{Bulk density} = \text{CNT weight}(kg)/\text{CNT volume}(m^3) \quad (1)$$

where CNT refers to the carbon nanotube aggregate.

According to the present invention, the use of the four-component catalyst with little fine powder allows the carbon nanotubes grown on the catalyst to have a density distribution and an average particle diameter in specific ranges.

The carbon nanotubes of the carbon nanotube aggregate according to the present invention may have a strand diameter of 10 to 50 nm.

The bundle type carbon nanotubes grown on the aluminum-based granular catalyst have a particle size distribution (Dcnt) of 0.5 to 1.0.

Unless otherwise mentioned, the term "bundle type carbon nanotubes" used herein refers to a type of carbon nanotubes in which the carbon nanotubes are arranged in parallel or get entangled to form bundles or ropes.

The particle size distribution (Dcnt) can be defined by Expression 2:

$$D\text{cnt} = [Dn90 - Dn10]/Dn50 \quad (2)$$

where Dn90, Dn10, and Dn50 are the number average particle diameters of the CNTs after standing in distilled water for 3 hours, as measured under 90%, 10%, and 50% in the absorption mode using a particle size analyzer (Microtrac), respectively.

The particle size distribution may be, for example, from 0.55 to 0.95 or from 0.55 to 0.9.

The bundle type carbon nanotubes may have an aspect ratio of 0.9 to 1. The bundle type carbon nanotubes may have a diameter of 1 to 50 μm. The aspect ratio range and the type of the carbon nanotubes can be achieved by a specific process of the four-component catalyst, which is presented in the present invention. Specifically, the aspect ratio is defined by Expression 3:

$$\text{Aspect ratio} = \frac{\text{the shortest diameter passing through the center of CNT}}{\text{the longest diameter passing through the center of CNT}} \quad (3)$$

where CNT refers to the carbon nanotube aggregate.

In the catalyst used for the production of the carbon nanotube assembly, catalytic components and active components are supported on a granular support. The catalytic components include first and second catalytic components. The active components include first and second active components. The four-component catalyst is prepared by calcination of the catalytic components and the active components. The number of moles (x) of the first catalytic component, the number of moles (y) of the second catalytic component, the number of moles (p) of the first active component, and the number of moles (q) of the second active component with respect to 100 moles of the support may satisfy the following relationships:

$$1 \leq y \leq 20;$$

$$0.1 \leq y/[x+y] \leq 0.5;$$

$$1 \leq p+q \leq 20; \text{ and}$$

$$0.1 \leq [p+q]/[x+y] \leq 0.5.$$

In a preferred embodiment of the present invention, based on 100 moles of the aluminum-based support, the number of moles (x) of the first catalytic component and the number of moles (y) of the second catalytic component satisfy $30 \leq x+y \leq 53$, and the number of moles (p) of the first active component and the number of moles (q) of the second active component satisfy $3 \leq p+q \leq 13$. More preferably, based on 100 moles of the aluminum-based support, x and y satisfy $30 \leq x+y \leq 44$ or $35 \leq x+y \leq 44$, and p and q satisfy $3 \leq z \leq 9.5$ or $5 \leq z \leq 9.5$.

In a preferred embodiment of the present invention, the supported catalyst is a calcined catalyst in which the catalytic components and the active components are supported on the granular support. The granular support may have an aspect ratio of 1.2 or less, and the average aspect ratio (As) of the support before the catalytic components and the active components are supported on the support and the average aspect ratio (A$_{CAT}$) of the catalyst after the catalytic components and the active components are supported on the support may satisfy $0.8 \leq A_{CAT}/A_s \leq 1.2$.

According to a preferred embodiment of the present invention, the granular support may have a bulk density of 0.6 to 1.2 g/cm$^3$, and the supported catalyst prepared by impregnation of the catalytic components and the active components into the granular support may have a bulk density of 0.8 to 1.5 g/cm$^3$.

The supported catalyst of the present invention has a structure in which the catalytic components and the active components are uniformly impregnated into and coated on the surface and pores of the support. Due to this structure, the amount of a fine powder as an aggregate of the catalytic metals remaining uncoated can be reduced to less than 5% and the spherical or potato-like shape of the support is maintained unchanged even after completion of the catalyst production. The spherical or potato-like shape refers to a three-dimensional shape having an aspect ratio of 1.2 or less such as a sphere or ellipse.

The catalyst of the present invention may have a particle diameter (or average particle diameter) of 30 to 150 μm, as measured before the calcination, and each of the support and catalyst may have a spherical or potato-like shape with a primary particle diameter of 10 to 50 nm.

According to one embodiment, the first catalytic component may be selected from Fe, Ni, and a mixture thereof, the second catalytic component may be Co, the first active component may be Mo, and the second active component may be V. Particularly, the addition of vanadium (V) as the second active component leads to a high yield of carbon nanotubes and a significant increase in the density (or bulk density) of carbon nanotubes.

The catalytic components used in the present invention may include at least one metal selected from Fe and Ni as the first catalytic component and Co as the second catalytic component. For example, the first catalytic component may be selected from the group consisting of Fe salts, Fe oxides, Fe compounds, Ni salts, Ni oxides, Ni compounds, and mixtures thereof, and the second catalytic component may be selected from the group consisting of Co salts, Co oxides, Co compounds, and mixtures thereof. As another example, the first catalytic component may be selected from the group consisting of $Fe(NO_3)_2 \cdot 6H_2O$, $Fe(NO_3)_2 \cdot 9H_2O$, $Fe(NO_3)_3$, $Fe(OAc)_2$, $Ni(NO_3)_2 \cdot 6H_2O$, and mixtures thereof, and the second catalytic component may be selected from the group consisting of $Co(NO_3)_2 \cdot 6H_2O$, $Co_2(CO)_6$, $[Co_2(CO)_6(t\text{-}BuC\!\!=\!\!CH)]$, $Co(OAc)_2$, and mixtures thereof.

The first active component may be Mo, for example, a Mo salt, a Mo oxide, or a Mo compound. As another example, the first active component may be $(NH_4)_6Mo_7O_{24} \cdot 4H_2O$, $Mo(CO)_6$, or $(NH_4)MoS_4$, which may be dissolved in distilled water before use.

The second active component may be V, for example, a V salt, a V oxide, or a V compound. As another example, the second active component may be $NH_4VO_3$, which may be dissolved in distilled water before use.

The total amount of the first and second active components may be from 0.2 to 4% by weight, based on the weight of the aqueous metal solution.

The first active component (Mo) and the second active component (V) may be in a weight ratio of 6-0.1:0.1-6, more preferably 5-1:2-4. The catalyst essentially includes molybdenum (Mo) and vanadium (V) as the active components. The ratio of the metal components may be controlled to obtain carbon nanotubes in a high yield, for example, 5000% or more, 6000% or more, or 7500% or more.

The four-component catalyst of the present invention has a structure in which the surface and pores of the aluminum-based support are coated with a monolayer or multilayer of the catalytic components and the active components, and the amount of a fine powder after ultrasonication is 10% or less of the amount of the catalyst. Accordingly, the density distribution of the carbon nanotubes grown on the catalyst is much more uniform than that of carbon nanotubes grown on a conventional catalyst. In one embodiment of the present invention, the amount of a fine powder having a number average particle diameter not larger than 32 µm, as measured after ultrasonic shaking at 40 watts for 1 minute, may be 10% or less, preferably 5% or less, of the amount of the catalyst taking into consideration the particle diameter (or average particle diameter) range (32-95 µm) of the aluminum-based support.

For reference, the fine powder is defined as an aggregate of the catalytic materials and the active materials attached to the catalyst after ultrasonication. The fine powder passes through a sieve but is fundamentally different from the catalytically active materials well-coated on the support in terms of particle size and catalytic activity. The fine powder is an island-like aggregate attached to the catalyst and is a cause of low CNT yield. Portions of the catalytic materials and the active materials are somewhat weakly attached to the catalyst and are thus separated from the catalyst during ultrasonication to form the fine powder.

The supported catalyst of the present invention is preferably prepared by an impregnation method for the following reasons: the supported catalyst has a higher inherent bulk density than coprecipitated catalysts; unlike coprecipitated catalysts, the supported catalyst produces a small amount of a fine powder with a size of 10 microns or less, which reduces the possibility of occurrence of a fine powder due to attrition during fluidization; and high mechanical strength of the supported catalyst effectively stabilizes the operation of a fluidized bed reactor.

The aluminum-based granular support used in the catalyst of the present invention may be made of an aluminum compound selected from the group consisting of $Al_2O_3$, $AlO(OH)$, $Al(OH)_3$, and mixtures thereof. The aluminum-based granular support is preferably made of alumina ($Al_2O_3$). The support may be in the form of a powder instead of a water-soluble salt such as aluminum nitrate. The use of the support in the form of a powder allows the impregnated supported catalyst to have a very high bulk density of 0.5 to 1.5 $g/cm^3$. This is considered a significant difference between the impregnated catalyst and coprecipitated catalysts. The high bulk density of the catalyst enables the operation of a reactor at a high linear velocity in the production of carbon nanotubes and serves to markedly increase the hourly productivity of carbon nanotubes.

The aluminum (Al)-based support may further include at least one oxide selected from the group consisting of $ZrO_2$, MgO, and $SiO_2$. The aluminum (Al)-based granular support has a spherical or potato-like shape. The material for the aluminum (Al)-based granular support has a structure suitable to provide a relatively high surface area per unit weight or volume, such as a porous structure, a molecular sieve structure, or a honeycomb structure.

According to a preferred embodiment of the present invention, the granular support may have a primary particle diameter of 10 to 50 nm, a porosity of 0.1 to 1.0 $cm^3/g$, and a specific surface area of 100 to 300 $m^2/g$.

As described above, the supported catalyst may be prepared by sequentially adding a multi-carboxylic acid and the precursors of first and second catalytic components to the precursors of first and second active components to obtain a transparent aqueous metal solution, providing the transparent aqueous metal solution to the aluminum-based support, followed by drying under vacuum and calcination.

The transparent aqueous metal solution means an aqueous solution free of precipitates. The term "precipitates" means, for example, deep yellow precipitates such as $Fe(MoO)_3\!\downarrow$ or dark red precipitates such as $Fe(VO_3)_3\!\downarrow$ formed as a result of the reaction of $Fe^{3+}$ with $3MoO^-$ or $3VO_3^-$ at room temperature when an iron (Fe) precursor (such as iron nitrate) as the catalytic component is added to water and a Mo precursor (such as ammonium molybdate) and a V precursor (such as ammonium vanadate) as the active components are added thereto.

The multi-carboxylic acid used in the present invention is a compound having one or more carboxyl groups. The multi-carboxylic acid is highly soluble and serves as a complexing agent to suppress the formation of precipitates and to facilitate the synthesis of the catalyst. The multi-carboxylic acid also serves as an activator to promote the synthesis of carbon nanotubes.

The multi-carboxylic acid may be selected from dicarboxylic acids, tricarboxylic acids, tetracarboxylic acids, and mixtures thereof. Examples of such multi-carboxylic acids include citric acid, oxalic acid, succinic acid, and tartaric acid. The multi-carboxylic acid may be used in an amount of 0.1 to 1.5% by weight, based on the weight of the aqueous metal solution. The ratio of the moles of the multi-carboxylic acid to the sum of the moles of the first and second active components is 0.2-2.0:1, more preferably 0.2-1.0:1, most preferably 0.2-0.5:1. Within this range, no precipitation may take place in the aqueous metal solution and no cracks may be caused during calcination.

The order of addition of the multi-carboxylic acid and the catalytic components may be changed. For example, the multi-carboxylic acid may be added to a Mo component and/or a V component before the addition of a Fe component or a Co component is added. In this case, the formation of precipitates is suppressed, and as a result, the area of the support surface covered by precipitates is reduced, resulting in an improvement in the activity of the catalyst.

Specifically, the supported catalyst of the present invention may be prepared by: sequentially blending the multi-carboxylic acid component and an aqueous solution of the precursors of first and second catalytic components with an aqueous solution of the precursors of first and second active components to obtain a transparent aqueous metal solution, and mixing the aluminum-based support with the transparent aqueous metal solution; and drying the mixture under vacuum at 40 to 80° C. and calcining the dried mixture at 650 to 800° C. In the supported catalyst for carbon nanotube production, the surface and pores of the aluminum-based support are impregnated and coated with the catalytic components and the active components.

The drying under vacuum may be performed by rotary evaporation at a temperature of 40 to 80° C. for 30 minutes to 3 hours.

Thereafter, the calcination may be performed at a temperature of 650 to 800° C., preferably 700 to 750° C. The calcination time is not limited and may be, for example, in the range of 30 minutes to 15 hours. Within these ranges, a large amount of the catalyst can be synthesized in a short time and the catalytic components and the active components can be uniformly dispersed on the surface of the aluminum-based support.

It is preferred to add the multi-carboxylic acid to the aqueous solution of the precursors of first and second active components before addition of the aqueous solution of the precursors of first and second catalytic components. In the case where the order of addition of the multi-carboxylic acid and the catalytic components is controlled such that the multi-carboxylic acid is added to the aqueous solution of the precursors of active components before addition of the aqueous solution of the precursors of catalytic components, the formation of precipitates is suppressed, and as a result, the area of the support surface covered by precipitates is reduced, resulting in an improvement in the activity of the catalyst. The transparent aqueous metal solution thus obtained has a concentration of 0.01 to 0.4 g/ml, specifically 0.01 to 0.3 g/ml, which is efficient in terms of reactivity.

According to one embodiment, the method may further include aging with rotation or stirring at 45 to 80° C. before the drying under vacuum. The aging may be performed for a maximum of 5 hours, for example, 20 minutes to 5 hours or 1 to 4 hours.

The method may further include preliminarily calcining the vacuum-dried mixture at 250 to 400° C. before the calcination.

A portion of the total amount of the aqueous metal solution may be impregnated into the aluminum-based support just before the preliminary calcination and the remainder of the aqueous metal solution may be impregnated into the aluminum-based support just before the calcination. Specifically, it is preferred in terms of reaction efficiency that a maximum of 50 vol %, for example, 1 to 45 vol % or 5 to 40 vol %, of the aqueous metal solution is impregnated into the aluminum-based support just before the preliminary calcination and the remainder of the aqueous metal solution is impregnated into the aluminum-based support just before the calcination.

The carbon nanotube aggregate of the present invention may be produced by a method including: feeding the supported catalyst for carbon nanotube production into a fluidized bed reactor and introducing at least one carbon source selected from $C_1$-$C_4$ saturated or unsaturated hydrocarbons, and optionally together with a mixed gas of hydrogen and nitrogen, into the reactor at 500 to 900° C., and decomposing the carbon source and growing carbon nanotubes on the catalyst surface by chemical vapor synthesis.

According to the chemical vapor synthesis, the catalyst for carbon nanotube production is charged into the reactor and the carbon source is then supplied to the reactor at ambient pressure and high temperature to produce carbon nanotubes. The hydrocarbon is thermally decomposed and is infiltrated into and saturated in the catalyst particles. Carbon is deposited from the saturated catalyst particles and grows into carbon nanotubes.

According to one embodiment, carbon nanotubes may be grown for 30 minutes to 8 hours after the carbon source is introduced into the catalyst for carbon nanotube production. According to the present invention, the yield of bundles of carbon nanotubes increases and the rate of increase in yield decreases moderately with increasing reaction time, enabling control over yield depending on processing time and achieving a yield of 5000% or more, 6000% or more, 7500% or more, presumably 10,000% or more, without being bound by processing time.

The carbon source may be a $C_1$-$C_4$ saturated or unsaturated hydrocarbon. Examples of such hydrocarbons include, but are not limited to, ethylene ($C_2H_4$), acetylene ($C_2H_2$), methane ($C_2H_4$), and propane ($C_3H_8$). The mixed gas of hydrogen and nitrogen transports the carbon source, prevents carbon nanotubes from burning at high temperature, and assists in the decomposition of the carbon source.

The use of the supported catalyst according to the present invention for the synthesis of carbon nanotubes enables the formation of an aggregate of carbon nanotubes grown on the spherical or potato-like catalyst without changing the shape of the catalyst. As a result, the carbon nanotubes have a high bulk density while maintaining a normal distribution in particle size. That is, the carbon nanotubes increase in size without substantial change in the catalyst shape. Therefore, the average aspect ratio ($A_{CAT}$) of the catalyst may be 1.2 or less and the average aspect ratio ($A_{CNT}$) of the carbon nanotube aggregate may also be 1.2 or less.

The following examples are provided to assist in understanding the invention. However, it will be obvious to those skilled in the art that these examples are merely illustrative and various modifications and changes are possible without departing from the scope and spirit of the invention. Accordingly, it should be understood that such modifications and changes are encompassed within the scope of the appended claims.

<Example 1> Production of CNTs Depending on the Weight Ratio of Mo:V

<Example 1-1> Metal Catalyst (Mo:V=3:3)

A. Preparation of Aqueous Metal Solution

A four-component metal catalyst having a combination of Co and Fe as catalytic components and Mo and V as active components was prepared by the following procedure. 0.055 g of $(NH_4)_6Mo_7O_{24} \cdot H_2O$ as a Mo precursor and 0.069 g of $NH_4VO_3$ as a V precursor were dissolved in 20 ml of water in flask A, and then 0.037 g of citric acid as a multi-carboxylic acid, 2.175 g of $Co(NO_3)_2 \cdot H_2O$ as a Co precursor, and 0.318 g of $Fe(NO_3)_2 \cdot H_2O$ as a Fe precursor were added thereto to prepare an aqueous metal solution.

The aqueous metal solution was observed to be clear and free of precipitates. Since 7 moles of Mo was present in one mole of $(NH_4)_6Mo_7O_{24}$, the number of moles of the active components Mo and V and the multi-carboxylic acid were 0.3127, 0.5889, and 0.1926 moles, respectively, indicating that the molar ratio of the multi-carboxylic acid to the active components was 0.21:1.

The molar ratio of Co:Fe was fixed to 30:8 and the weight ratio of Mo:V was adjusted to 3:3.

B. Preparation of Support 2.5 g of $Al_2O_3$ (D50v=76 microns, pore volume: 0.64 $cm^3$/g, surface area: 237 $m^2$/g, Saint Gobain) as an aluminum-based support was placed in flask B.

C. Preparation of Supported Catalyst Having First Catalyst Layer

One half (10.6 g) of the total amount (21.3 g) of the solution in flask A was added to flask B. The catalytically active metal precursors were sufficiently supported on the $Al_2O_3$, followed by aging with stirring in a thermostatic bath at 60° C. for 5 min. The mixture was dried with rotation at 150 rpm under vacuum for 30 min while maintaining the temperature. The dried mixture was calcined at 350° C. for 1 h to prepare a homogeneous supported catalyst.

When the number of moles of the $Al_2O_3$ (2.5 g) was assumed to be 100 moles, the numbers of moles of Fe, Co, Mo, and V were 8, 30, 3, and 6 moles, respectively.

D. Preparation of Supported Catalyst Having Second Metal Catalyst Layer

The catalyst having the first metal catalyst layer was placed in flask C, and the other half (10.6 g) of the metal solution in flask A was added thereto. The catalytically active metal precursors were sufficiently supported on $Al_2O_3$, followed by aging with stirring in a thermostatic bath at 60° C. for 5 min.

The mixture was dried with rotation at 150 rpm under vacuum for 30 min while maintaining the temperature. The dried mixture was calcined at 725° C. for 3 h to prepare a homogeneous catalyst.

The catalyst was passed through a 32-micron sieve and the passed particles were weighed to calculate the content of a fine powder, which was defined as the aggregate of the particles. The calculated content of the fine powder was 0 wt %. After dispersion in water and ultrasonic shaking at 40 watts for 1 min, the proportion of particles having a size of 32 μm or less was measured using a particle size analyzer (Microtrac, bluewave). As a result, the amount of the fine powder after ultrasonication corresponded to 0% on the basis of number average particle diameter.

E. CNT Synthesis

A test for the synthesis of carbon nanotubes using the catalyst prepared in D was conducted in a fluidized bed reactor on a laboratory scale. Specifically, the catalyst was mounted at the center of a quartz tube having an inner diameter of 55 mm and heated to 700° C. under a nitrogen atmosphere. A mixed gas of nitrogen, hydrogen and ethylene gas in the same volume ratio was allowed to flow at a rate of 180 ml/min for a total of 1 h while maintaining the same temperature, affording a carbon nanotube aggregate.

<Example 1-2> Metal Catalyst (Mo:V=4.5:1.5)

The procedure of Example 1-1 was repeated except that the weight ratio of Mo:V was adjusted to 4.5:1.5.

<Example 1-3> Metal Catalyst (Mo:V=4:2)

The procedure of Example 1-1 was repeated except that the weight ratio of Mo:V was adjusted to 4:2.

<Reference Example 1> Production of CNTs Using Trimetallic Catalyst (Co—Fe—Mo or V)

<Reference Example 1-1> Trimetallic Catalyst (Co—Fe—Mo)

The procedure of Example 1-1 was repeated except that the weight ratio of Mo:V was adjusted to 6:0.

<Reference Example 1-2> Trimetallic Catalyst (Co—Fe—V)

The procedure of Example 1-1 was repeated except that the weight ratio of Mo:V was adjusted to 0:6.

SEM Images

Figure 2A:
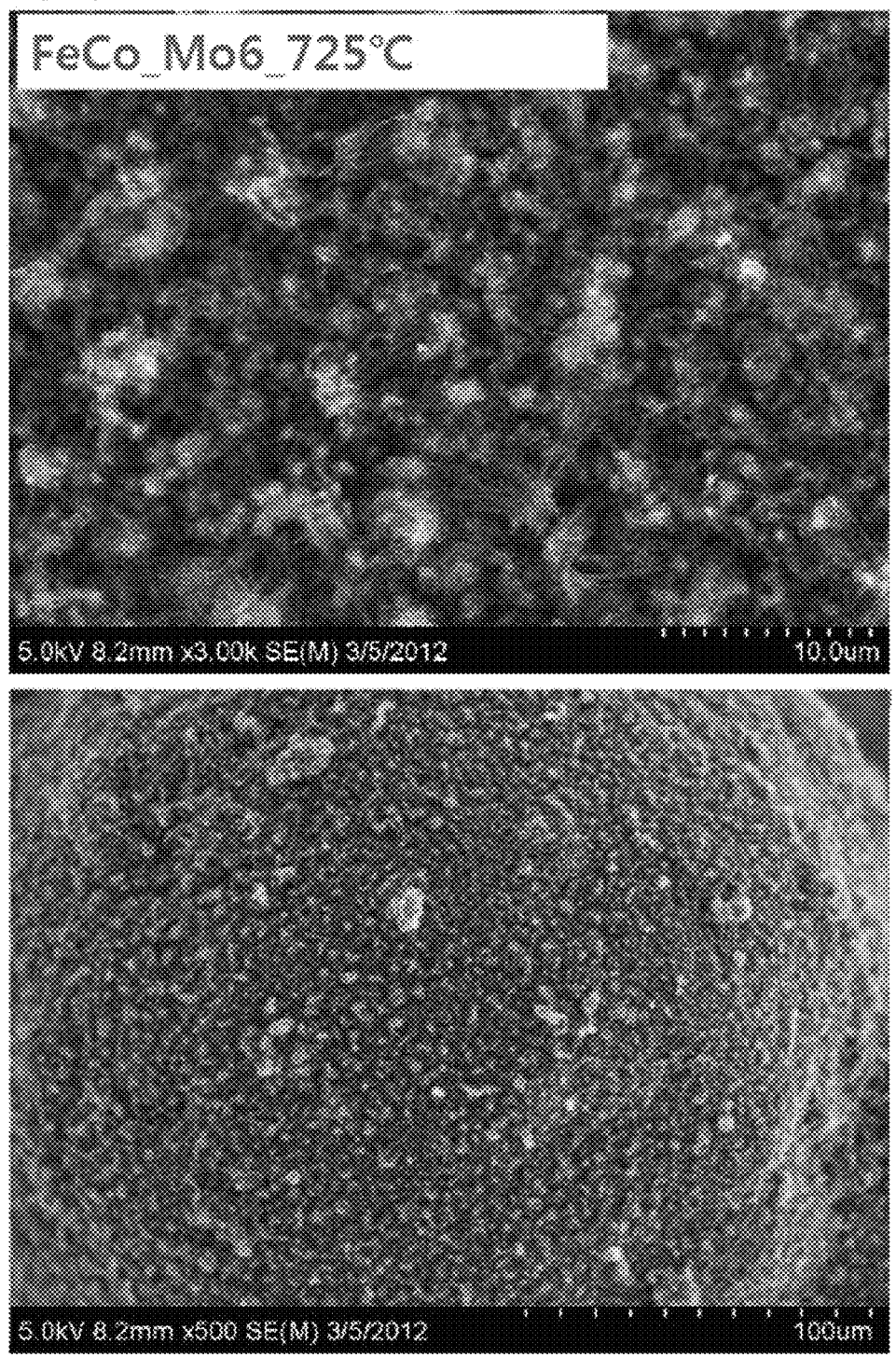
FIGS. 2a and 2b are SEM images of CNT aggregates produced in Reference Example 1-1 and Example 1-1, respectively.
Figure 2B:
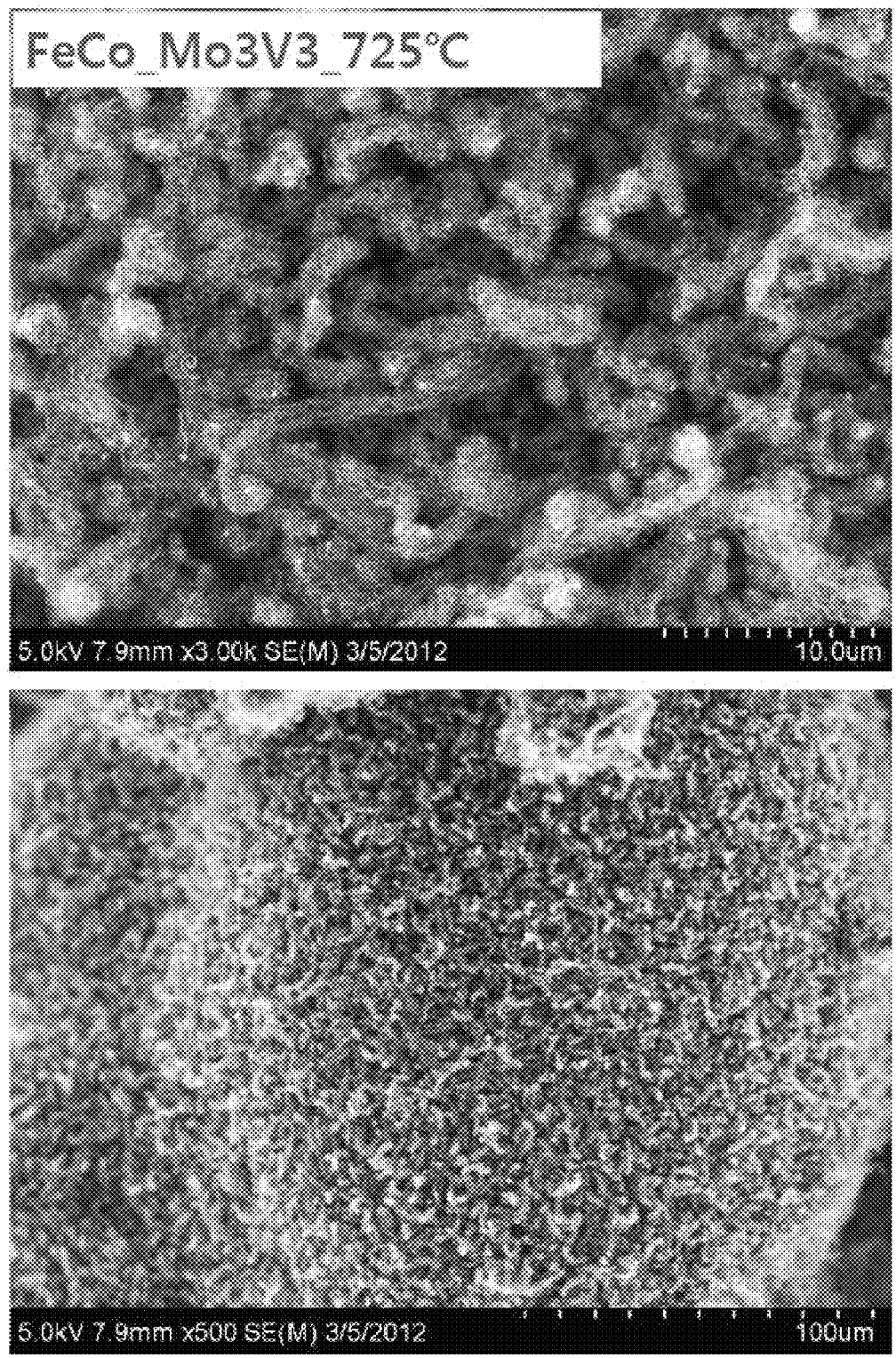

The CNT aggregates of Example 1-1 and Reference Example 1-1 were observed using FE-SEM (HITACHI S-4800, Cold cathode field emission gun, 3-stage electromagnetic lens system, SE detector) at an accelerated voltage of 5 kV, an emission current of 10 μA, and a working distance of 8 mm, and the SEM images are shown in FIGS. 1, 2a and 2b, respectively.

FIG. 1 shows a bulk shape of the CNTs produced in Example 1-1. The CNTs were observed to be potato-like or spherical in bulk shape.

The support had an average aspect ratio (As) of 1.2 or less before the catalytic components and the active components were supported thereon. The average aspect ratio ($A_{CAT}$) of the catalyst after the catalytic components and the active components were supported thereon and the average aspect ratio (As) of the support were shown to satisfy $0.8 \leq A_{CAT}/A_S \leq 1.2$.

FIG. 2a shows that the CNT aggregate produced using the trimetallic catalyst (Co—Fe—Mo) in Reference Example 1-1 consisted of a number of CNTs, which simply got entangled and were random in shape. In contrast, FIG. 2b shows that the CNT aggregate produced using the tetrametallic catalyst (Co—Fe—Mo—V) in Example 1-1 consisted of a number of CNTs, which were grown with high density, had a spherical or potato-like bulk shape, and aggregated regularly to form bundles or ropes.

Bulk Densities of the Catalysts

Each of the catalysts was filled in a measuring cylinder and weighed. The weight was divided by the volume of the measuring cylinder. As a result, the catalysts of Example 1-1, Example 1-2, and Example 1-3 were confirmed to have bulk densities of 1.0 $g/cm^3$, 1.2 $g/cm^3$, and 1.1 $g/cm^3$, respectively.

Bulk Densities of CNTs

The CNTs were filled in a measuring cylinder and weighed. The weight was divided by the volume of the measuring cylinder. As a result, the CNTs of Example 1-1, Example 1-2, and Example 1-3 were confirmed to have bulk densities of 210 $kg/m^3$, 183 $kg/m^3$, and 170 $kg/m^3$, respectively.

Aspect Ratios

The longest diameter and the shortest diameter passing through the center of CNT were measured from the corresponding SEM image. The aspect ratio of the CNT was determined by dividing the longest diameter by the shortest diameter. The CNTs of Example 1-1, Example 1-2, and Example 1-3 were confirmed to have aspect ratios of 0.90, 0.95, and 1.0, respectively.

Particle Diameter Distributions (Dcnt)

Each of the CNT aggregates was allowed to stand in distilled water for 3 h. The number average particle diameter of the CNT aggregate was measured in the absorption mode using a particle size analyzer (Microtrac) and was substituted into Formula 1 to calculate the particle diameter distribution (Dcnt) of the CNTs. The CNTs of Example 1-1, Example 1-2, and Example 1-3 were confirmed to have particle diameter distributions (Dcnt) of 0.88, 0.92, and 0.95, respectively.

The experimental results are summarized in Table 1.

TABLE 1

|  | x (mole) | y (mole) | p (mole) | q (mole) | Weight ratio of Mo:V | Bulk density of catalyst (g/cm³) | Bulk density of CNTs (kg/m³) | Aspect ratio | Particle diameter distribution (Dcnt) |
|---|---|---|---|---|---|---|---|---|---|
| Example 1-1 | 30 | 8 | 3 | 6 | 3:3 | 1.0 | 210 | 0.90 | 0.88 |
| Example 1-2 | 30 | 8 | 5.5 | 3.5 | 4.5:1.5 | 1.2 | 183 | 0.95 | 0.92 |
| Example 1-3 | 30 | 8 | 6 | 3 | 4:2 | 1.1 | 170 | 1.0 | 0.95 |

Reaction Yield Measurement

The contents of the carbon nanotubes obtained at room temperature were measured using an electronic scale. The reaction yield was calculated by substituting the weight of the catalyst used for CNT synthesis and the total weight after the reaction into the following expression:

CNT yield(%)=(the total weight after the reaction (g)−the weight of the catalyst used(g))/the weight of the catalyst used(g)×100

Figure 3:
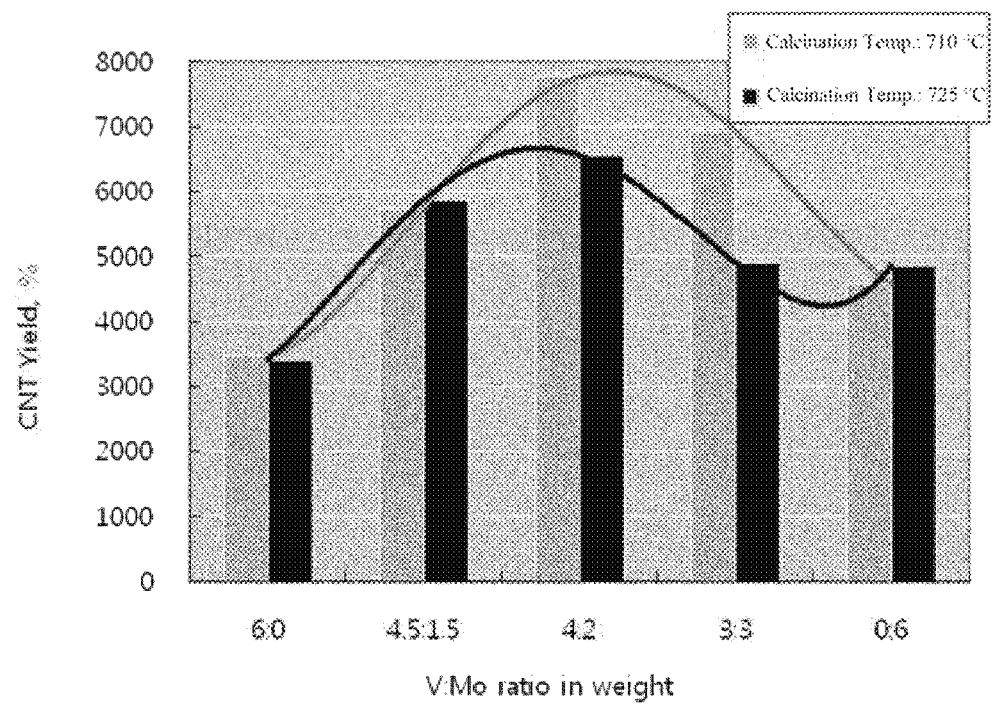
FIG. 3 is a graph showing changes in the yield of CNTs depending on Mo:V ratio and calcination temperature in Reference Examples 1-1 and 1-2 and Examples 1-1, 1-2, and 1-3.

Referring to FIG. 3, the yield of the CNTs produced using the metal catalyst consisting of Co, Fe, and Mo in Reference Example 1-1 was about 3500%, and the yield of the CNTs produced using the metal catalyst consisting of Co, Fe, and V in Reference Example 1-2 was lower than 5000%. In contrast, the yield of the CNTs produced using the metal catalyst including Mo and V in a ratio of 4.5:1.5 in Example 1-2 was 6000% or more, the yield of the CNTs produced using the metal catalyst including Mo and V in a ratio of 4:2 in Example 1-3 was 6500% or more, and the yield of the CNTs produced using the metal catalyst including Mo and V in a ratio of 3:3 in Example 1-1 was close to 5000%.

<Example 2> CNT Yield Depending on Calcination Temperature

<Example 2-1> Mo:V=3:3

The procedure of Example 1-1 was repeated except that the metal catalyst was calcined at 710° C.

<Example 2-2> Mo:V=4.5:1.5

The procedure of Example 1-2 was repeated except that the metal catalyst was calcined at 710° C.

<Example 2-3> Mo:V=4:2

The procedure of Example 1-3 was repeated except that the metal catalyst was calcined at 710° C.

Referring to FIG. 3, the yield of the CNTs produced in Example 2-2 was comparable to the yield of the CNTs produced in Example 1-2. The CNTs were produced using the catalysts including Mo and V in the same weight ratio (4.5:1.5), except that the calcination temperatures were different (710° C. in Example 2-2 and 725° C. in Example 1-2). In contrast, the yield (≥7500%) of the CNTs produced in Example 2-3 was higher by ≥+1000% than that of the CNTs produced in Example 1-3. The CNTs were produced using the catalysts including Mo and V in the same weight ratio (4:2), except that the calcination temperatures were different (710° C. in Example 2-3 and 725° C. in Example 1-3). The yield (~6900%) of the CNTs produced in Example 2-1 was higher by ≥+2000% than that of the CNTs produced in Example 1-1. The CNTs were produced using the catalysts including Mo and V in the same weight ratio (3:3), except that the calcination temperatures were different (710° C. in Example 2-1 and 725° C. in Example 1-1).

<Example 3> CNT Yield Depending on Reaction Time

CNTs were synthesized in the same manner as in Example 1-1, except that the reaction time was changed. Changes in the CNT yield as a function of reaction time from 1 to 8 h were observed.

<Reference Example 2> CNT Yield Depending on Reaction Time

CNTs were synthesized in the same manner as in Reference Example 1-1, except that the reaction time was changed. Changes in the CNT yield as a function of reaction time from 1 to 8 h were observed.

Figure 4:
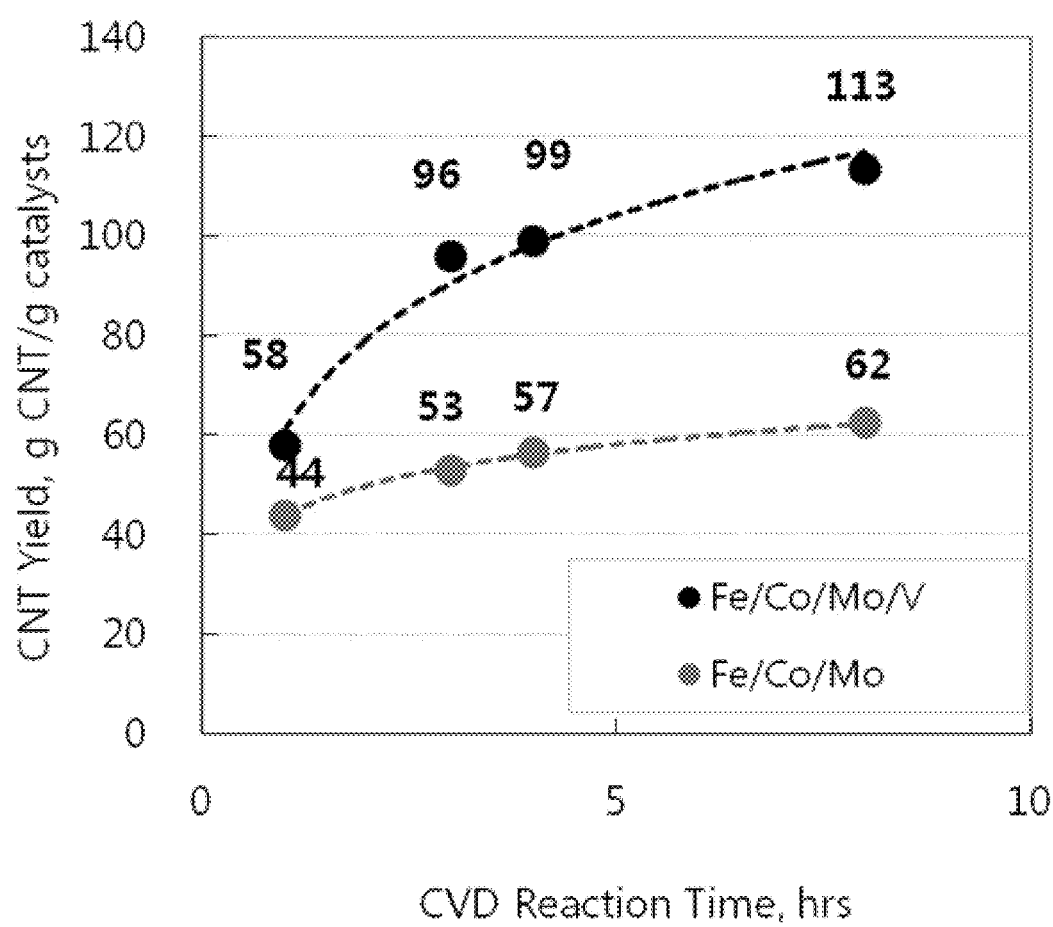
FIG. 4 is a graph showing changes in the yield of CNTs as a function of reaction time in Example 3 and Reference Example 2.

Referring to FIG. 4, when the reaction time was 1 h, the use of the four-component catalyst (cobalt (Co)-iron (Fe)-molybdenum (Mo)-vanadium (V)) led to an at least 30% increase in CNT yield compared to the use of the three-component catalyst (Co—Fe—Mo). In addition, when the three-component catalyst (Co—Fe—Mo) was used, the rate of increase in yield steeply decreased with increasing reaction time. It could be thus expected that the yield would not be increased any more when the reaction time reaches 8 h. In contrast, the use of the four-component catalyst (cobalt (Co)-iron (Fe)-molybdenum (Mo)-vanadium (V)) led to a high yield and moderately decreased the rate of increase in yield with increasing reaction time, allowing the reaction to proceed for a longer time, for example, 8 h or more or 10 h or more, and enabling the production of CNT bundles in higher yield.

The present invention can overcome the disadvantage of low CNT yield encountered in the use of conventional impregnated catalysts for carbon nanotube production. The supported catalyst of the present invention has controlled activity and can produce a controlled amount of a fine powder, enabling the synthesis of bundle type carbon nanotubes in high yield. Therefore, the supported catalyst of the present invention can find application in various fields, such as energy materials, functional composites, pharmaceuticals, batteries, and semiconductors, where carbon nanotubes are used.

What is claimed is:

1. A method for producing an impregnated catalyst comprising:
   1) sequentially blending a multi-carboxylic acid component and an aqueous solution of precursors of first and second catalytic components with an aqueous solution of precursors of first and second active components to obtain a transparent aqueous metal solution, and mixing an aluminum containing granular support with a portion of the transparent aqueous metal solution to form a first mixture;
   2) drying the first mixture under vacuum at 40 to 80° C.;
   3) preliminarily calcining the dried first mixture;
   4) mixing the remainder of the transparent aqueous solution with the preliminarily calcined first mixture to form a second mixture;
   5) drying the second mixture under vacuum at 40 to 80° C.; and
   6) calcining the dried second mixture at 650 to 800° C. to obtain a catalyst for carbon nanotube production in which the surface and pores of the aluminum containing support are impregnated and coated with the catalytic components and the active components.

2. The method according to claim 1, further comprising aging at 45 to 80° C. before the drying under vacuum in step 2).

3. The method according to claim 1, wherein step 3) is performed at 250 to 400° C.

4. The method according to claim 1, wherein the transparent aqueous metal solution has a concentration of 0.01 to 0.4 g/ml.

5. The method according to claim 1, wherein the multi-carboxylic acid is used in an amount of 0.2 to 2.0 moles, assuming that the sum of the number of moles (p) of the first active component and the number of moles (q) of the second active component equals 1.

6. The method according to claim 1, wherein the number of moles (x) of the first catalytic component, the number of moles (y) of the second catalytic component, the number of moles (p) of the first active component, and the number of moles (q) of the second active component with respect to 100 moles of the aluminum containing granular support satisfy the following relationships:

$10 \leq x \leq 40$;

$1 \leq y \leq 20$;

$0.1 \leq y/[x+y] \leq 0.5$;

$1 \leq p+q \leq 20$; and $0.1 \leq [p+q]/[x+y] \leq 0.5$.

7. The method according to claim 1, wherein the multi-carboxylic acid is selected from dicarboxylic acids, tricarboxylic acids, tetracarboxylic acids, and mixtures thereof.

8. The method according to claim 1, wherein the first and second active components are in a weight ratio of 6-0.1:0.1-6.

9. The method according to claim 1, wherein the portion of the aqueous transparent metal solution comprises no more than 50 vol. % of the aqueous transparent metal solution.

10. The method according to claim 1, wherein the portion of the aqueous transparent metal solution comprises 5 to 40 vol. % of the aqueous transparent metal solution.

11. A method for producing an impregnated catalyst comprising:
   1) sequentially blending a multi-carboxylic acid component and an aqueous solution of precursors of first and second catalytic components with an aqueous solution of precursors of first and second active components to obtain a transparent aqueous metal solution, wherein a ratio of moles of the multi-carboxylic acid to a sum of moles of the first and second active components is 0.2-1.0:1, and mixing an aluminum-containing granular support with a portion of the transparent aqueous metal solution to form a first mixture, wherein the portion of the aqueous transparent metal solution comprises no more than 50 vol. % of the aqueous transparent metal solution;
   2) drying the first mixture under vacuum at 40 to 80° C.;
   3) preliminarily calcining the dried first mixture;
   4) mixing the remainder of the transparent aqueous solution with the preliminarily calcined first mixture to form a second mixture;
   5) drying the second mixture under vacuum at 40 to 80° C.; and
   6) calcining the dried second mixture at 650 to 800° C. to obtain a catalyst for carbon nanotube production in which the surface and pores of the aluminum-containing support are impregnated and coated with the catalytic components and the active components.

12. The method of claim 11, wherein:
   the first catalytic component is selected from the group consisting of Fe salts, Fe oxides, Fe compounds, Ni salts, Ni oxides, Ni compounds, and mixtures thereof;
   the second catalytic component is selected from the group consisting of Co salts, Co oxides, Co compounds, and mixtures thereof;
   the first active component is selected from the group consisting of Mo salts, Mo oxides, or Mo compounds;
   the second active component is selected from the group consisting of V salts, V oxides, or V compounds;
   wherein the total amount of the first and second active components is 0.2 to 4% by weight, based on the weight of the aqueous metal solution.

* * * * *